(12) United States Patent
Braganca, Jr. et al.

(10) Patent No.: US 12,525,557 B2
(45) Date of Patent: Jan. 13, 2026

(54) DIE-BEAM ALIGNMENT FOR LASER-ASSISTED BONDING

(71) Applicant: STATS ChipPAC Pte. Ltd., Singapore (SG)

(72) Inventors: Wagno Alves Braganca, Jr., Incheon (KR); KyungOe Kim, Incheon (KR); TaeKeun Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 25 days.

(21) Appl. No.: 18/429,418

(22) Filed: Jan. 31, 2024

(65) Prior Publication Data

US 2024/0170422 A1    May 23, 2024

Related U.S. Application Data

(63) Continuation of application No. 17/068,233, filed on Oct. 12, 2020, now Pat. No. 11,929,334.

(Continued)

(51) Int. Cl.
| | |
|---|---|
| *B23K 26/03* | (2006.01) |
| *B23K 1/005* | (2006.01) |
| *B23K 26/06* | (2014.01) |
| *H01L 23/00* | (2006.01) |
| *H05K 3/34* | (2006.01) |

(52) U.S. Cl.
CPC ............ *H01L 24/06* (2013.01); *B23K 1/0056* (2013.01); *H01L 24/03* (2013.01); *H05K 3/34* (2013.01); *H01L 2224/0363* (2013.01); *H05K 2203/107* (2013.01)

(58) Field of Classification Search
CPC ... H01L 24/81; H01L 24/75; H01L 2924/014; H01L 2924/15311; H01L 21/67259; B23K 1/0056; G02B 27/0927; G02B 27/0961; G02B 2027/0138
See application file for complete search history.

(56) References Cited

U.S. PATENT DOCUMENTS

| | | |
|---|---|---|
| 6,278,078 B1 | 8/2001 | Walvoord et al. |
| 10,095,118 B2 | 10/2018 | Bibby et al. |
| (Continued) | | |

FOREIGN PATENT DOCUMENTS

| | | |
|---|---|---|
| CN | 101438397 A | 5/2009 |
| CN | 110621432 A | 12/2019 |
| (Continued) | | |

*Primary Examiner* — Eliseo Ramos Feliciano
*Assistant Examiner* — David J Goodwin
(74) *Attorney, Agent, or Firm* — Brian M. Kaufman; Robert D. Atkins; PATENT LAW GROUP: Atkins and Associates, P.C.

(57) ABSTRACT

A method of making a semiconductor device involves the steps of disposing a first semiconductor die over a substrate and disposing a beam homogenizer over the first semiconductor die. A beam from the beam homogenizer impacts the first semiconductor die. The method further includes the steps of determining a positional offset of the beam relative to the first semiconductor die in a number of pixels, using a first calibration equation to convert the number of pixels into a distance in millimeters, and moving the beam homogenizer the distance in millimeters to align the beam and first semiconductor die.

14 Claims, 15 Drawing Sheets

Related U.S. Application Data

(60) Provisional application No. 62/990,668, filed on Mar. 17, 2020.

(56) References Cited

U.S. PATENT DOCUMENTS

| | | |
|---|---|---|
| 10,423,072 B2 | 9/2019 | Xie et al. |
| 2002/0111003 A1 | 8/2002 | Williams |
| 2003/0068836 A1* | 4/2003 | Hongo ............... H10D 86/0251 |
| | | 438/30 |
| 2004/0113283 A1 | 6/2004 | Farnworth et al. |
| 2004/0264759 A1 | 12/2004 | Hattori et al. |
| 2006/0054608 A1 | 3/2006 | Cahill et al. |
| 2007/0096763 A1* | 5/2007 | Ehrmann ........... B23K 26/0861 |
| | | 324/754.03 |
| 2009/0268021 A1 | 10/2009 | Kawaragi |
| 2009/0319075 A1 | 12/2009 | Tian et al. |
| 2010/0277760 A1 | 11/2010 | Matsunaga |
| 2010/0292947 A1 | 11/2010 | Buk |
| 2012/0171876 A1 | 7/2012 | Venturini et al. |
| 2013/0208279 A1 | 8/2013 | Smith |
| 2015/0037984 A1 | 2/2015 | Zhang et al. |
| 2020/0091108 A1* | 3/2020 | Kim ........................ B23K 3/00 |
| 2020/0094336 A1 | 3/2020 | Ikushima |
| 2021/0202431 A1* | 7/2021 | Kobayashi ........... B23K 26/037 |
| 2021/0240074 A1 | 8/2021 | Spengler et al. |

FOREIGN PATENT DOCUMENTS

| | | |
|---|---|---|
| KR | 20120106051 A | 9/2012 |
| TW | 200924892 A | 6/2009 |

* cited by examiner

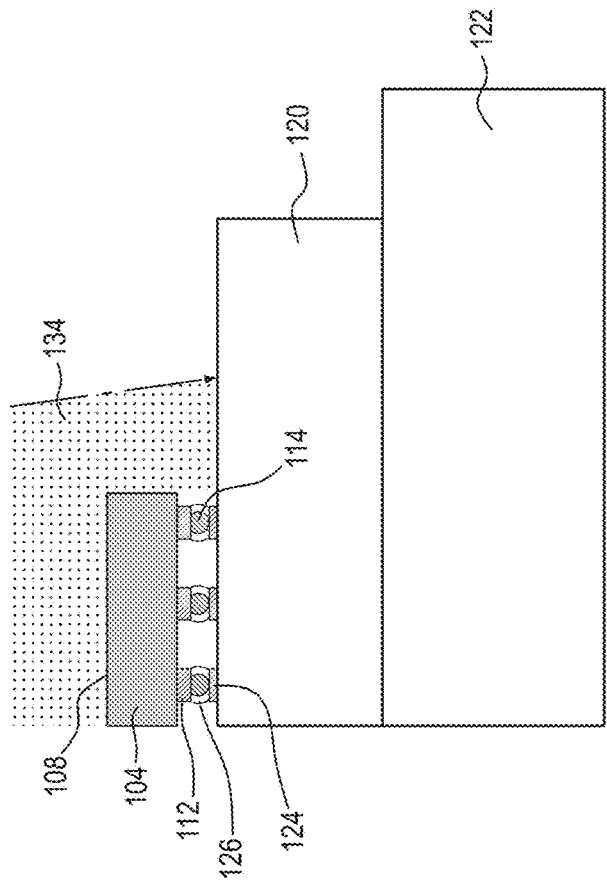
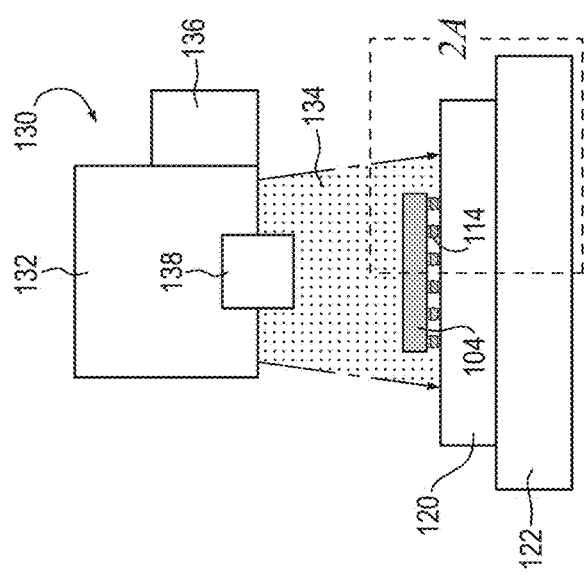
FIG. 2b
FIG. 2a

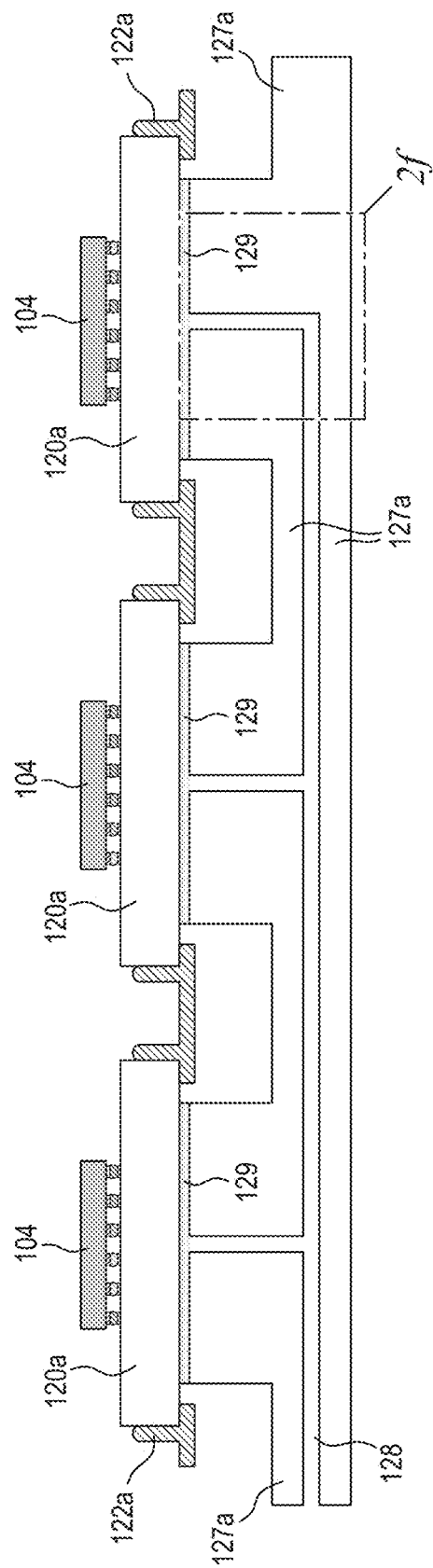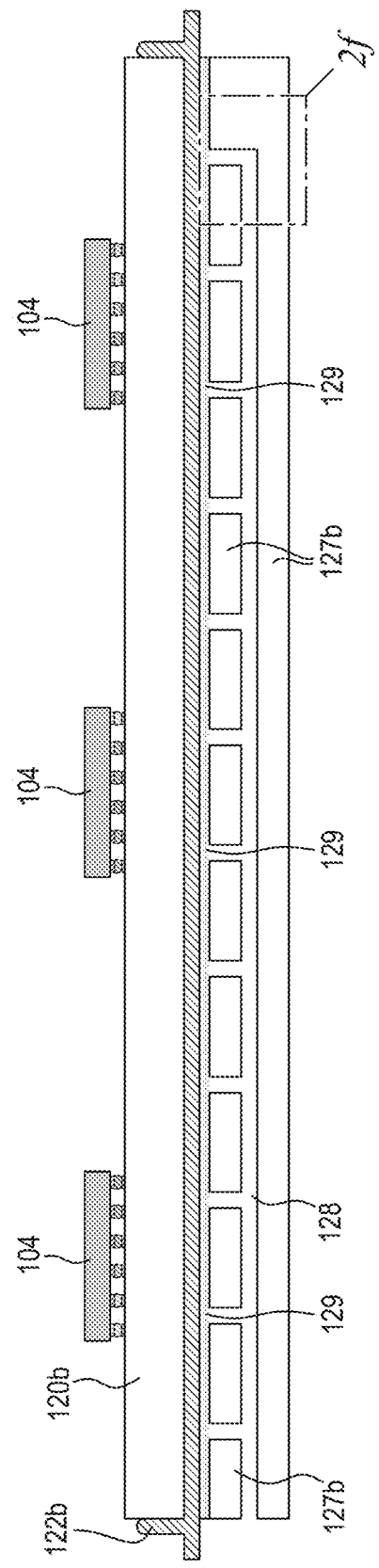

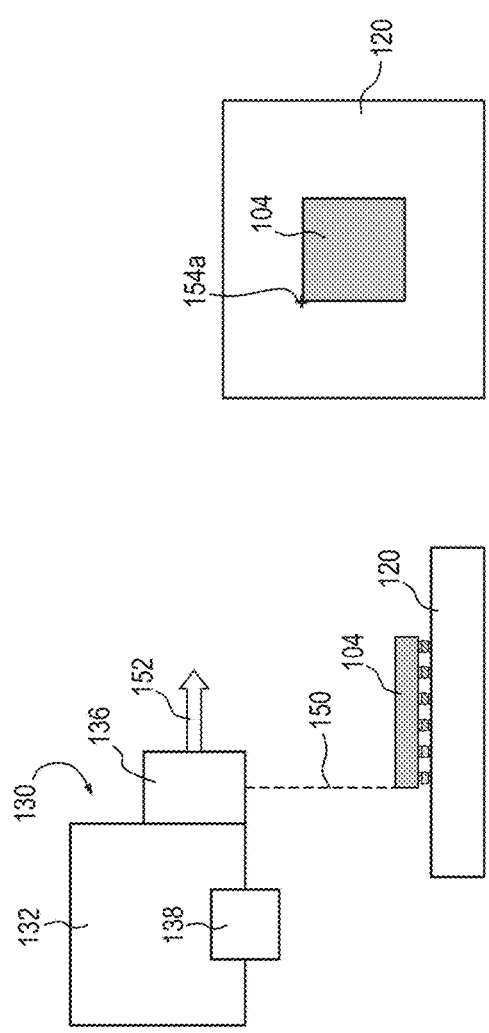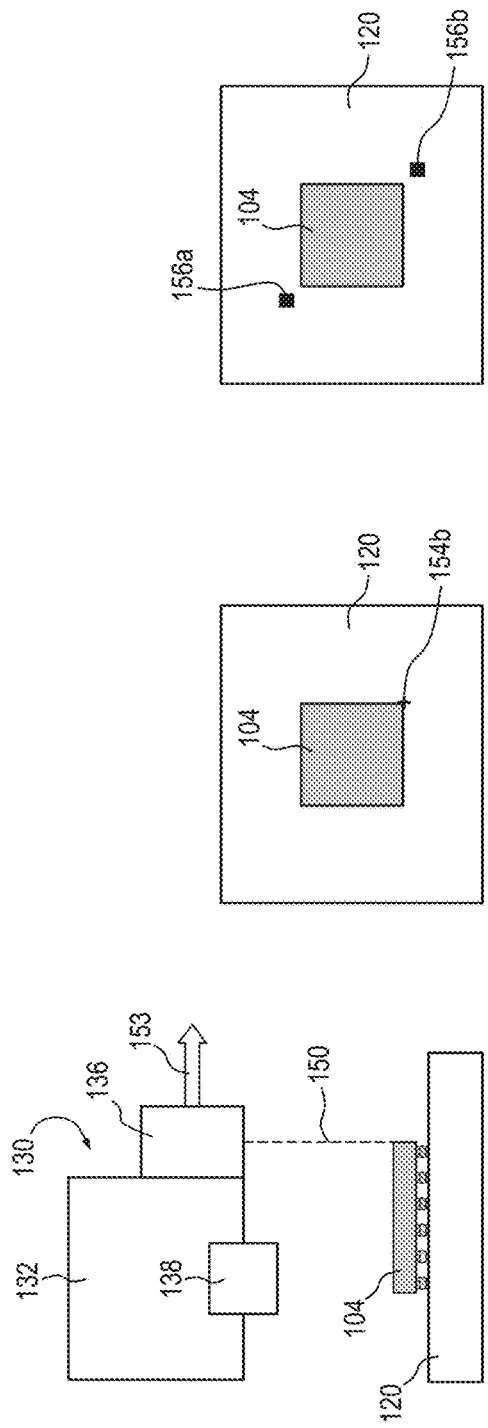

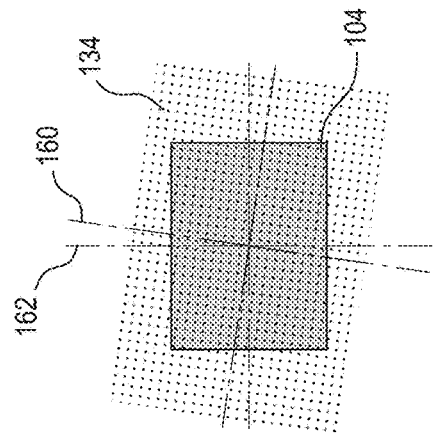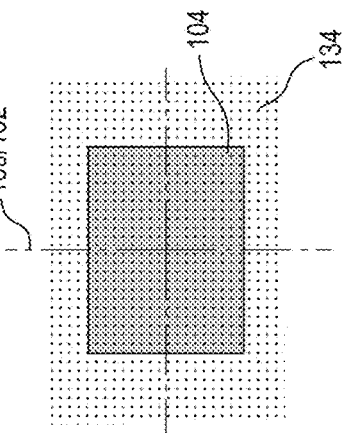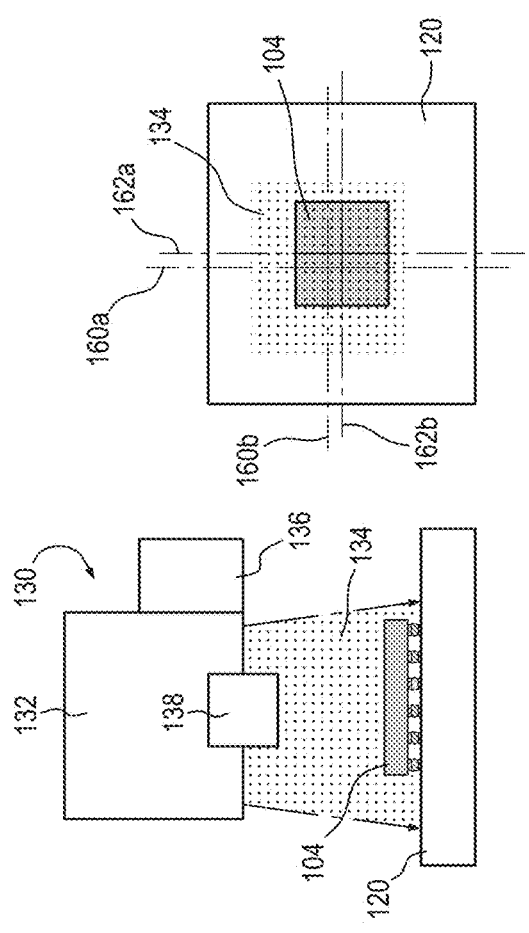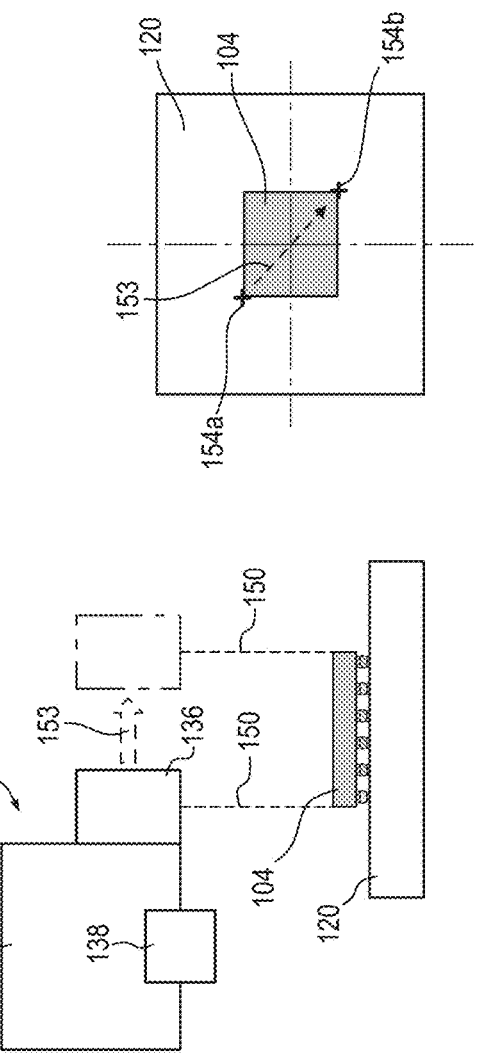
FIG. 4a
FIG. 4b
FIG. 4c
FIG. 5a

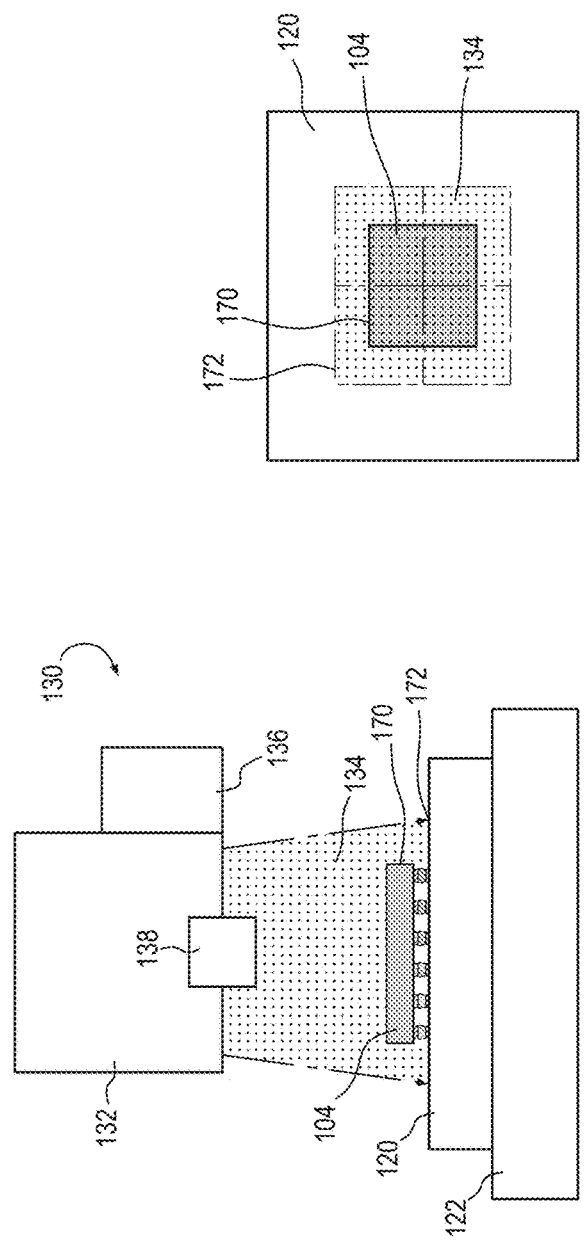
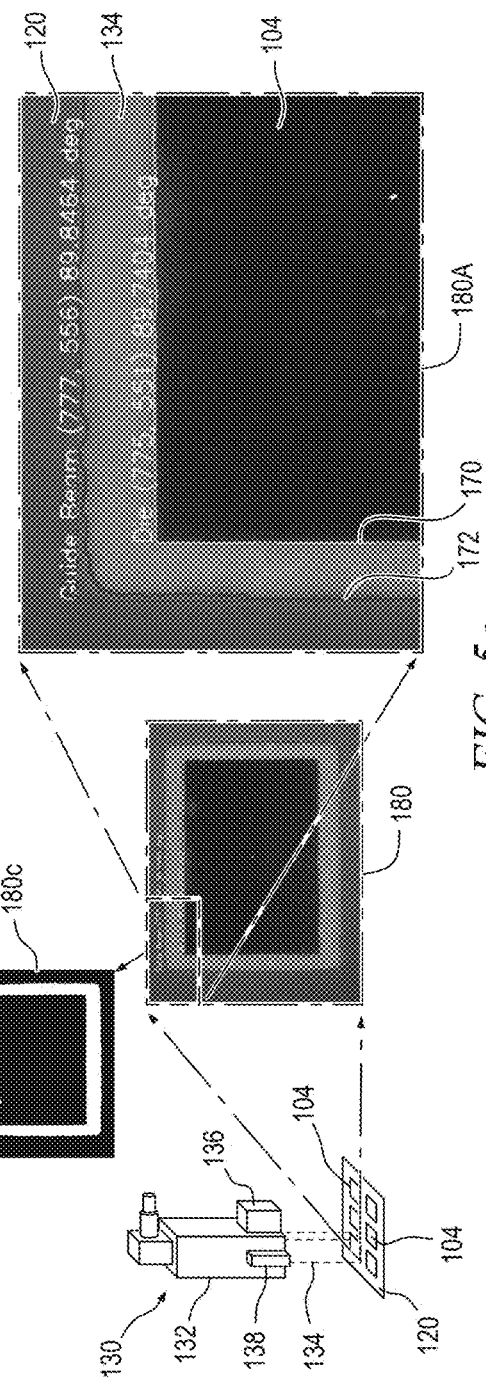
FIG. 5b
FIG. 5c

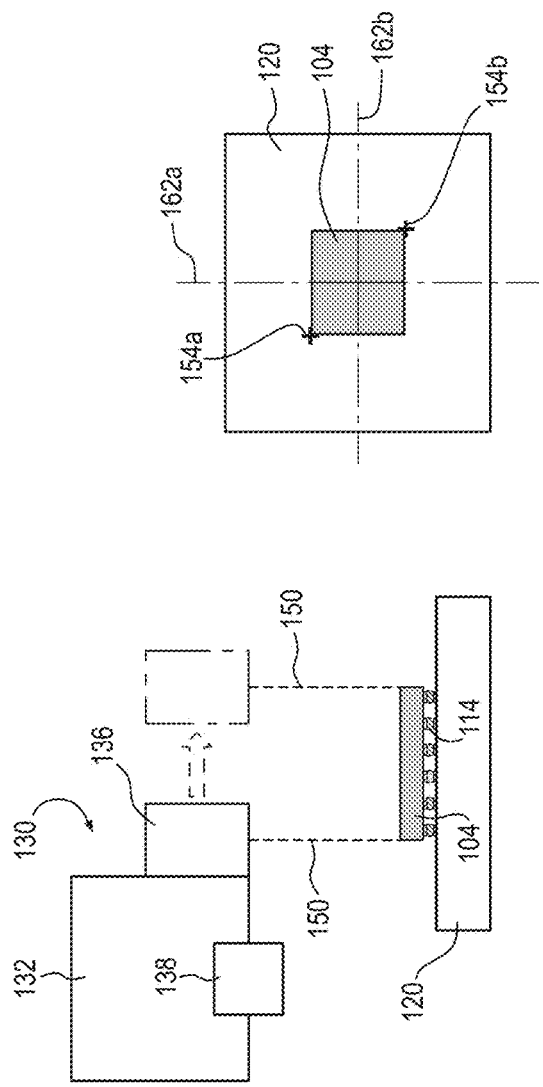
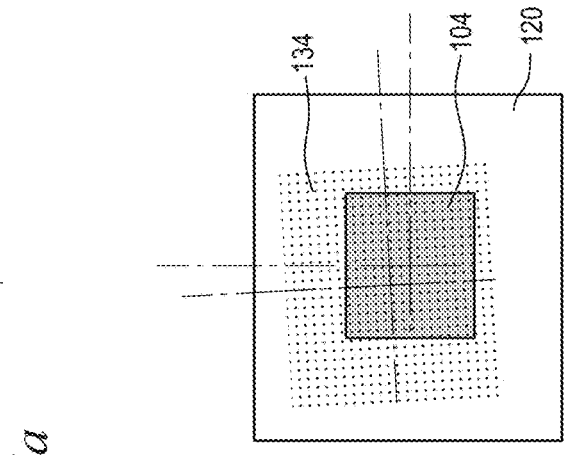
FIG. 7a
FIG. 7b

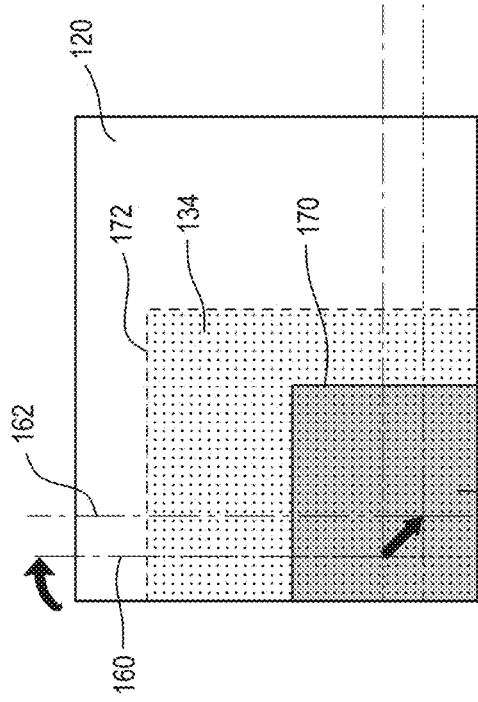
FIG. 7c
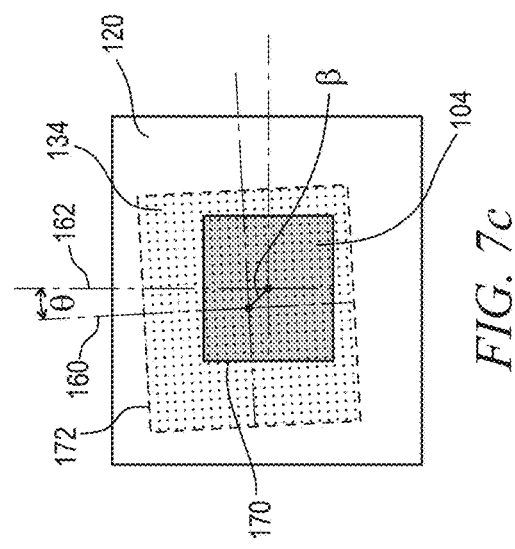
FIG. 7d
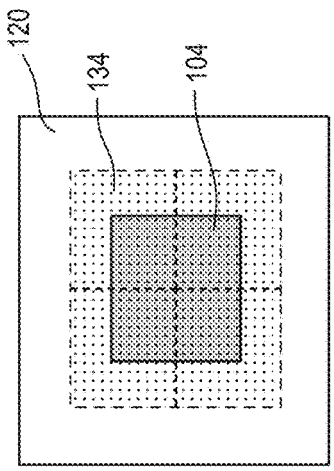
FIG. 7e
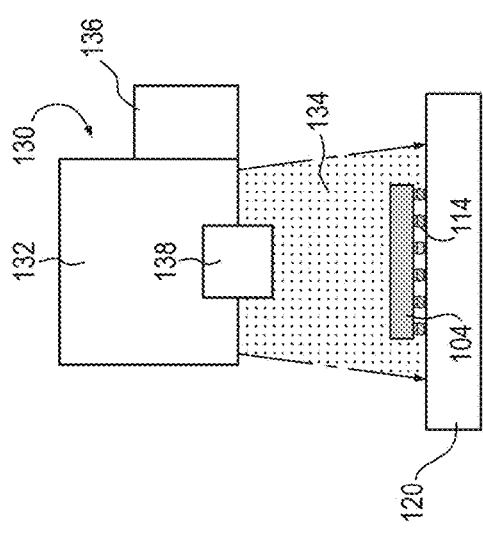

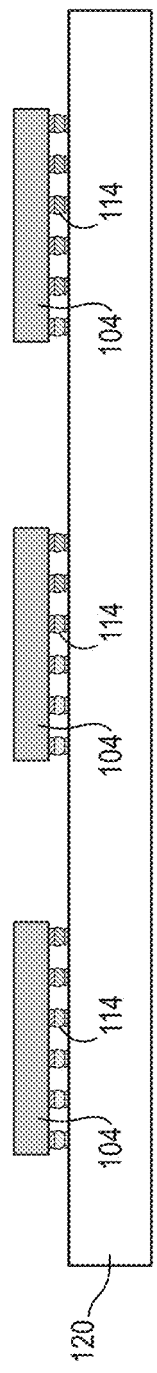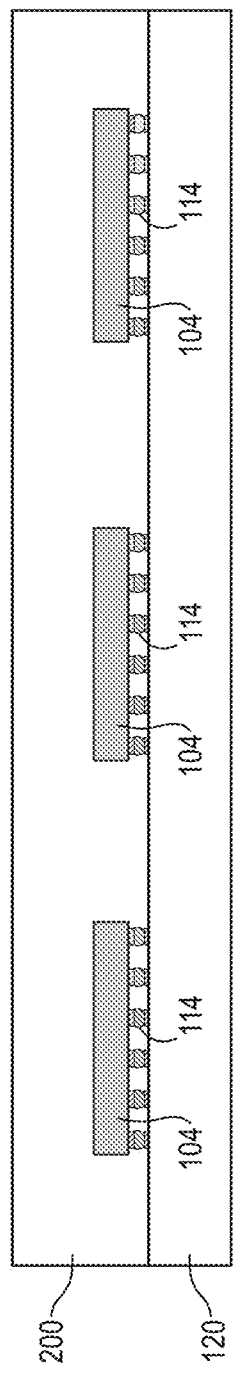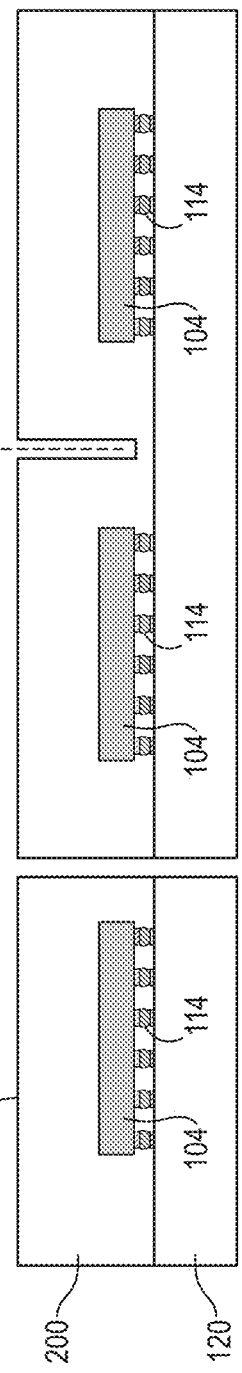

DIE-BEAM ALIGNMENT FOR LASER-ASSISTED BONDING

CLAIM OF DOMESTIC PRIORITY

The present application is a continuation of U.S. patent application Ser. No. 17/068,233, now U.S. Pat. No. 11,929,334, filed Oct. 12, 2020, which claims the benefit of priority of U.S. Provisional Application No. 62/990,668, filed Mar. 17, 2020, which applications are incorporated herein by reference.

FIELD OF THE INVENTION

The present invention relates in general to semiconductor devices and, more particularly, to a method of aligning a laser beam to a semiconductor die for laser-assisted bonding, and equipment therefor.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Many aspects of the manufacturing process become problematic and must be improved or replaced when semiconductor devices are reduced in size. Semiconductor die are typically mounted onto a substrate by disposing solder bumps of the semiconductor die in contact with contact pads of the substrate. The assembly is heated in an oven to reflow the solder bumps and thereby attach the semiconductor die to the substrate.

As semiconductor die, along with accompanying interconnect structures, are made smaller and thinner, the impact of the reflow oven process is more damaging to the electrical parts. As an improved solution, laser-assisted bonding (LAB) has been adopted. LAB uses a laser to apply energy directly to the back side of the die being mounted, which is converted to thermal energy to reflow solder bumps on the front side of the die. LAB provides more localized heat than a reflow oven and is able to reflow bumps with a shorter cycle time. The result is that LAB can be used to mount a die to a substrate with a reduced likelihood of damaging thin die and interconnect layers.

One important aspect of LAB is alignment between the semiconductor die and the area hit by the laser beam, referred to as die-beam alignment. Misalignment can result in reflow of only a portion of the solder bumps or applying thermal energy to a portion of the substrate not intended. In the prior art, die-beam alignment is typically confirmed visually by a human technician visually inspecting the alignment. However, human visual alignment is susceptible to human error, depends on the "feeling" of the operator as to whether alignment is achieved or not, and lacks a defined metric for quantitative evaluation. Therefore, the need exists for an improved die-beam alignment method for laser-assisted bonding.

BRIEF DESCRIPTION OF THE DRAWINGS

FIGS. 2a-2f illustrate laser-assisted bonding equipment;

FIGS. 3a-3c illustrate a vision alignment process used to coarsely align a laser beam homogenizer with the die being bonded;

FIGS. 4a-4c illustrate die-beam misalignment remaining after the initial vision alignment process;

FIGS. 5a-5e illustrate generation of a calibration equation used for subsequent fine die-beam alignment of X-Y position;

FIGS. 7a-7e illustrate usage of the calibration equations for fine die-beam alignment;

FIGS. 8a-8c illustrate completion of a semiconductor package after laser-assisted bonding.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding compound is deposited over the package to provide physical support and electrical isolation. The finished package is then inserted into an electrical system and the functionality of the semiconductor device is made available to the other system components.

Figure 1A:
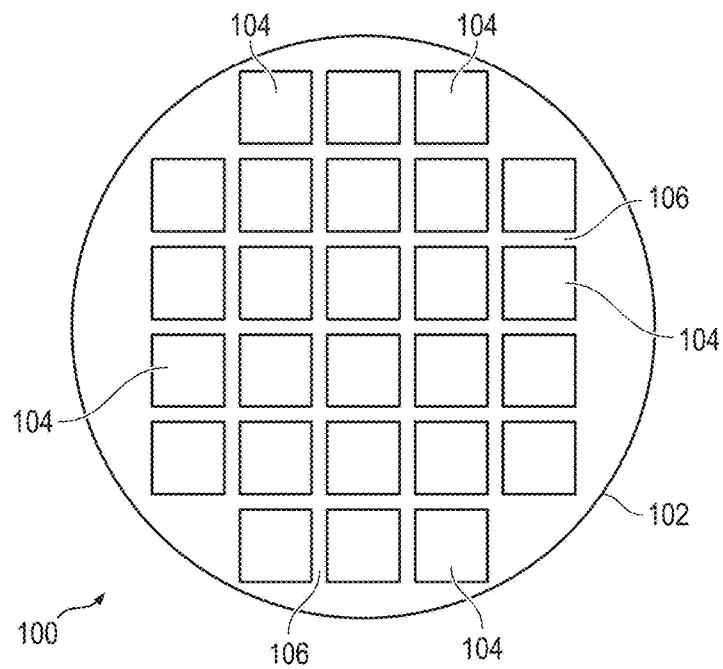
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
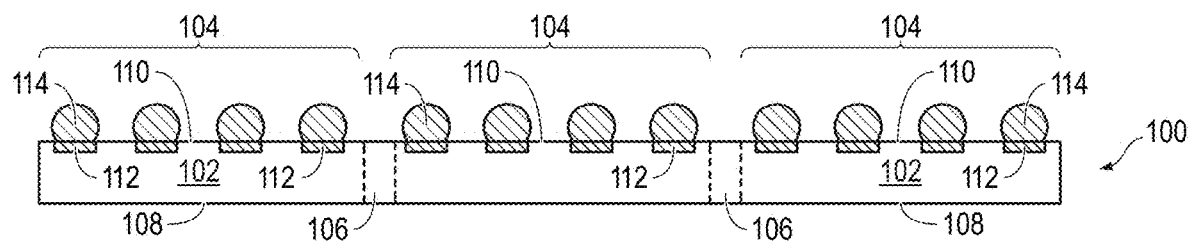

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

Figure 1C:
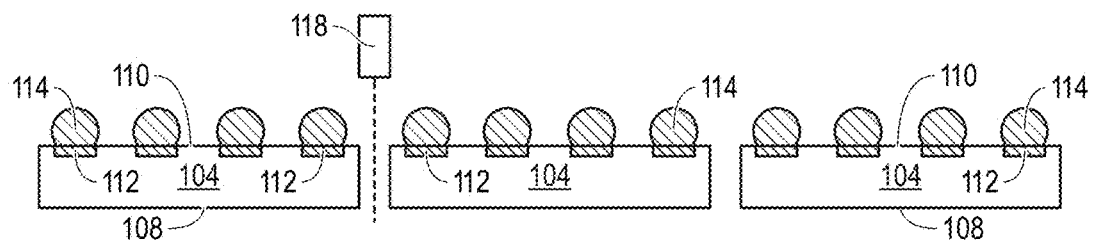

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

To incorporate semiconductor die 104 into an electronic device, bumps 114 are typically reflowed onto contact pads of a larger substrate 120 as shown in FIGS. 2a and 2b. A pick and place machine is used to place semiconductor die 104 onto substrate 120 at the desired location, and then laser-assisted bonding (LAB) is used to reflow bumps 114 onto contact pads 124 of substrate 120. Flux 126 is optionally added onto bumps 114 to improve reflow of the solder material onto the surfaces of contact pads 124. Non-conductive paste, non-conductive film, anisotropic conductive paste, and other suitable materials can be used instead of flux 126.

FIG. 2a shows a partial cross-sectional view of a carrier 122 having substrate 120 disposed thereon. Carrier 122 is a flat sheet of organic material, glass, silicon, polymer, or any other material suitable to provide physical support of substrate 120 during the manufacturing process. An optional double-sided tape, thermal release layer, UV release layer, or other appropriate interface layer can be disposed between carrier 122 and substrate 120. Substrate 120 is formed from a base insulating material with conductive layers 124 formed over top and bottom surfaces of the interposer and interleaved between layers of the insulating material. Conductive layers 124 include contact pads, conductive traces, and conductive vias configured as necessary to implement a desired signal routing. Portions of conductive layers 124 are electrically common or electrically isolated depending on the design and function of the device being formed. Conductive layers 124 can be one or more layers of Al, Cu, Sn, Ni, Au, Ag, or other suitable electrically conductive material. In some embodiments, passivation or solder resist layers are formed over the top and bottom surfaces of substrate 120 with openings to expose contact pads of conductive layer 124.

Substrate 120 can also be any suitable laminate interposer, PCB, wafer-form, strip interposer, leadframe, or other type of substrate. Substrate 120 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating material of substrate 120 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Substrate 120 can also be a multi-layer flexible laminate, ceramic, copper clad laminate, glass, or semiconductor wafer including an active surface containing one or more transistors, diodes, and other circuit elements to implement analog or digital circuits. Substrate 120 can be any suitable substrate for a semiconductor package or electronic device.

In laser-assisted bonding, a LAB assembly 130 is disposed over semiconductor die 104 with the semiconductor die sitting on substrate 120. LAB assembly 130 is mounted onto a gantry that allows the X-Y position of the LAB assembly to be controlled. X-Y position means that the position can be controlled along the X and Y axes, but not necessarily the Z-axis. The X-Y plane is oriented parallel to the major surfaces of substrate 120. The X-axis is the axis that extends left-to-right in FIG. 2a, and the Y-axis is the axis that extends into and out of the page of FIG. 2a. The Z-axis is oriented up-down in FIG. 2a, perpendicular to the major surfaces of substrate 120. The gantry that LAB assembly 130 is attached to may allow Z-axis (vertical) movement in some embodiments if desired. The gantry allows LAB assembly 130 to be rotated around the Z-axis in addition to being moved in the X-Y plane.

LAB assembly 130 includes a laser homogenizer 132. Homogenizer 132 receives a laser beam input via a fiber optic cable, waveguide, or other suitable mechanism, and outputs a homogenized laser beam 134 over semiconductor die 104. A beam homogenizer is a device that smooths out the irregularities in a laser beam profile and creates a more uniform one. Most beam homogenizers use a multifaceted mirror with square facets. The mirror reflects light at different angles to create a beam with uniform power across the entire profile of beam 134.

The energy of beam 134 is absorbed by semiconductor die 104 and converted to thermal energy to reflow bumps 114. In some embodiments, back surface 108 includes an electrically conductive layer formed over semiconductor die 104 as an electromagnetic interference (EMI) shielding layer. The conductive layer also improves efficiency of conversion from laser energy to thermal energy during LAB. Back surface 108 can also have other types of laser absorbing layers formed from any material that increases the absorption of the laser's energy. Beam 134 is typically configured to overlap the footprint boundary of semiconductor die 104 so that the beam hits not only the complete footprint of the semiconductor die, but also hits substrate 120 in a continuous path completely around the semiconductor die.

Die-beam alignment refers to a process of aligning beam 134 to die 104. LAB assembly 130 includes two cameras used for die-beam alignment. Vision camera 136 has a narrow field of view and is used to do coarse alignment of LAB assembly 130 over die 104 by finding fiducial markers on substrate 120 or by identifying the corners of die 104. Vision camera 136 usually only provides a zoomed in view of one corner of die 104 at a time. On the other hand, image-acquisition camera 138 provides a broader view, including the entire area around die 104 hit by beam 134 from a substantially perpendicular angle. Image-acquisition camera 138 is oriented with a view substantially perpendicular to substrate 120 and has a clear unobstructed shot of die 104 and substrate 120 around the die. Image-acquisition camera 138 is not tilted toward die 104, which would result in an angled image of the die. Image-acquisition camera 138 can be directly attached or mounted to beam homogenizer 132, attached or mounted to a support that holds the beam homogenizer onto the gantry, attached or mounted to the gantry using its own support arm, or otherwise supported in a position adjacent to the beam homogenizer.

Figure 2E:
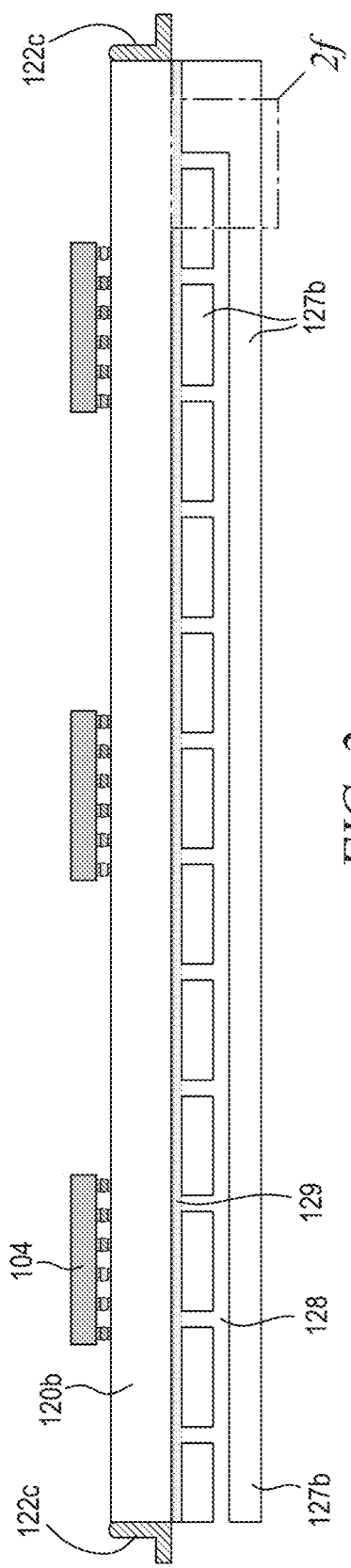

FIGS. 2c-2f show details of a carrier assembly utilizing a vacuum line to secure substrate 120 in place during laser-assisted bonding. FIG. 2c shows an embodiment with substrates 120a having been singulated prior to mounting of die 104. Individual units of substrate 120a are disposed on a boat carrier 122a that has vertical walls to hold the substrates in place. Boat carrier 122a has a separate area surrounded by a vertical wall for each unit substrate 120a. Boat carrier 122a is disposed over vacuum block 127a, either before or after die 104 are picked and placed on the boat carrier. Vacuum block 127a is typically made of a metal, such as stainless steel, copper, or aluminum. Vacuum block 127a has upward protrusions under each unit substrate 120a to support the substrates and allow boat carrier 122a to extend down between the protrusions while the substrates contact the vacuum block.

Vacuum block 127a includes a vacuum line 128 that branches out to run underneath each of the unit substrates 120a. Vacuum line 128 has a branch that extends up into each of the unit protrusions of vacuum block 127a. The air pressure in vacuum line 128 is reduced by a vacuum pump connected to the vacuum line. The reduced air pressure pulls substrates 120a onto vacuum block 127a to secure the substrates in place during laser-assisted bonding. Substrates 120a rest on a porous material 129 that increases the surface area of the substrates exposed to the vacuum. Porous material 129 can have non-porous side walls to keep the vacuum contained to within the footprint of the porous material. In other embodiments, porous material 129 has no side walls and is completely porous.

FIG. 2d illustrates an embodiment with substrate 120b where the substrate is not singulated prior to LAB and die 104 are packaged as a panel of units. Panel substrate 120b is disposed on boat carrier 122b. Boat carrier 122b includes a bottom under substrate 120b to support the substrate and side walls to keep the substrate positioned properly. Vacuum block 127b includes one large surface for carrier 122b to be placed on, whereas vacuum block 127a had discrete protrusions for each substrate 120a. Alternatively, vacuum block 127a could be used with boat carrier 122b and substrate 120b. Porous material 129 extends all the way across vacuum block 127b to distribute the vacuum across boat carrier 122b. In some embodiments, the bottom of boat carrier 122b includes openings to distribute the vacuum pressure to substrate 120b.

Figure 2F:
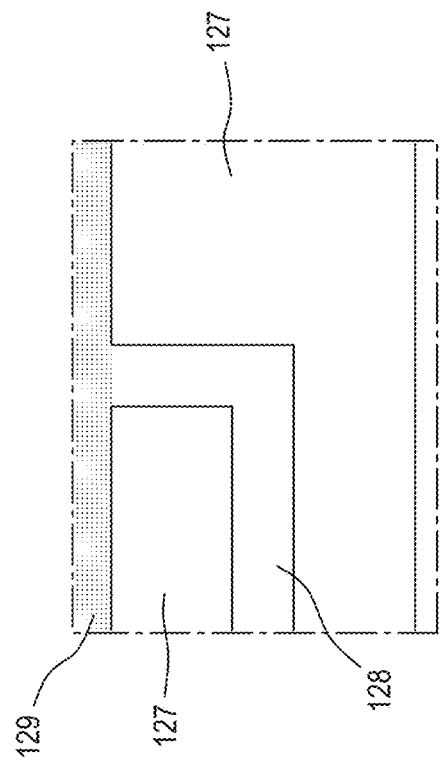

FIG. 2e illustrates an embodiment where panel substrate 120b is disposed over a boat carrier 122c that does not have a bottom. Boat carrier 122c includes side walls to reduce lateral movement of substrate 120b, but the substrate rests directly on vacuum block 127b and porous material 129 rather than on the boat carrier. FIG. 2f shows details of the vacuum block 127 with porous material 129. Substrate 120 sits on or over vacuum block 127 for the laser-assisted bonding process. Vacuum pressure applied through vacuum line 128 and porous material 129 holds substrate 120 in place during laser emission.

FIGS. 3a-3c illustrate a vision alignment process using vision camera 136. FIGS. 3a and 3b illustrate both a side and a top-down view of their respective process steps. The left image in FIGS. 3a and 3b shows the X-axis oriented left-right on the page and the Z-axis oriented up-down. The right image in FIGS. 3a and 3b is a view looking down the Z-axis onto the X-Y plane. Vision alignment begins by using a computer algorithm to locate die 104 on substrate 120 and moving LAB assembly 130 until center 150 of the camera's field of view is positioned directly over first corner 154a of die 104 as shown in FIG. 3a. Arrow 152 indicates the movement of LAB assembly 130 to get to corner 154a.

After finding first corner 154a, LAB assembly 130 is moved, as indicated by arrow 153, from the first corner to second corner 154b, as shown in FIG. 3b. Second corner 154b of die 104 is the corner positioned diagonally opposite first corner 154a. Knowing the positions of two opposite corners 154a and 154b allows the computer algorithm to locate the center of die 104 as the average position between the two corners. The distance moved can be calculated based on the distance stepper motors controlling LAB assembly 130 are moved to go from corner 154a to corner 154b.

Thereafter, the gantry moves LAB assembly 130 so that homogenizer 132 is positioned directly over die 104, i.e., the center of the homogenizer is aligned to the average position between corners 154a and 154b. Assembly 130 can be moved back halfway between the two corners to center vision camera 136 over die 104, and then the computer system knows how far to move the stepper motors to center homogenizer 132 over die 104. Any other suitable algorithm for centering homogenizer 132 over die 104 using vision camera 136 is used in other embodiments.

FIG. 3c illustrates an alternative embodiment where fiducial markers 156a and 156b are used to calculate the center position rather than corners of die 104. Fiducial markers 156 on substrate 120 can be located with higher speed and confidence by some vision camera systems than corners 154 of die 104. Fiducial markers can be any suitable shape, e.g., squares, circles, crosses, triangles, ASCII characters, QR codes, etc. The vision alignment process using fiducial markers 156 proceeds similarly to as shown in FIGS. 3a and 3b. The computer system uses vision camera 136 to find fiducial marker 156a, calculates the distance to fiducial marker 156b, and then moves the center of homogenizer 132 directly over the average position between the two fiducial markers.

The vision alignment process is adequate to get LAB assembly 130 positioned over die 104 but is not accurate enough to ensure die-beam alignment is within desired tolerances. Due to minor variances in the structure of LAB assembly 130, among other reasons, beam 134 may not be exactly aligned with die 104 after completion of the vision alignment process shown in FIGS. 3a-3c. FIGS. 4a-4c illustrate die-beam misalignment remaining after the vision alignment process. FIG. 4a shows both a side and a top-down view as in FIGS. 3a and 3b. While beam 134 covers the entire footprint of die 104, the beam is not centered over the die.

The top-down view of FIG. 4a has a crosshair 160 drawn to illustrate the center of beam 134, and a crosshair 162 illustrates the center of die 104. Axes 160a and 162a illustrate the centers of beam 134 and die 104, respectively, along the X-axis of the figure. Axes 160b and 162b illustrate the centers of beam 134 and die 104, respectively, along the Y-axis of the figure. Beam 134 is off-center on both the X-axis and Y-axis. The large area of substrate 120 covered by beam 134 to the top and left of die 104 is a potential problem.

In FIG. 4b, beam 134 is perfectly centered on die 104 but has a rotational offset. Rotational offsets are problematic for similar reasons as X-Y directional offsets. The corners of beam 134 extend farther from die 104 than expected, and the corners of the die may not be within the beam. After the vision alignment process from FIGS. 3a-3c, die-beam misalignment can be X-Y positional, rotational, or a combination of both. FIG. 4c illustrates perfect alignment in both X-Y position and rotation, which is ideal. Perfect alignment may be attained after vision alignment only but is unlikely in practice and nearly impossible to guarantee.

Figure 5D:
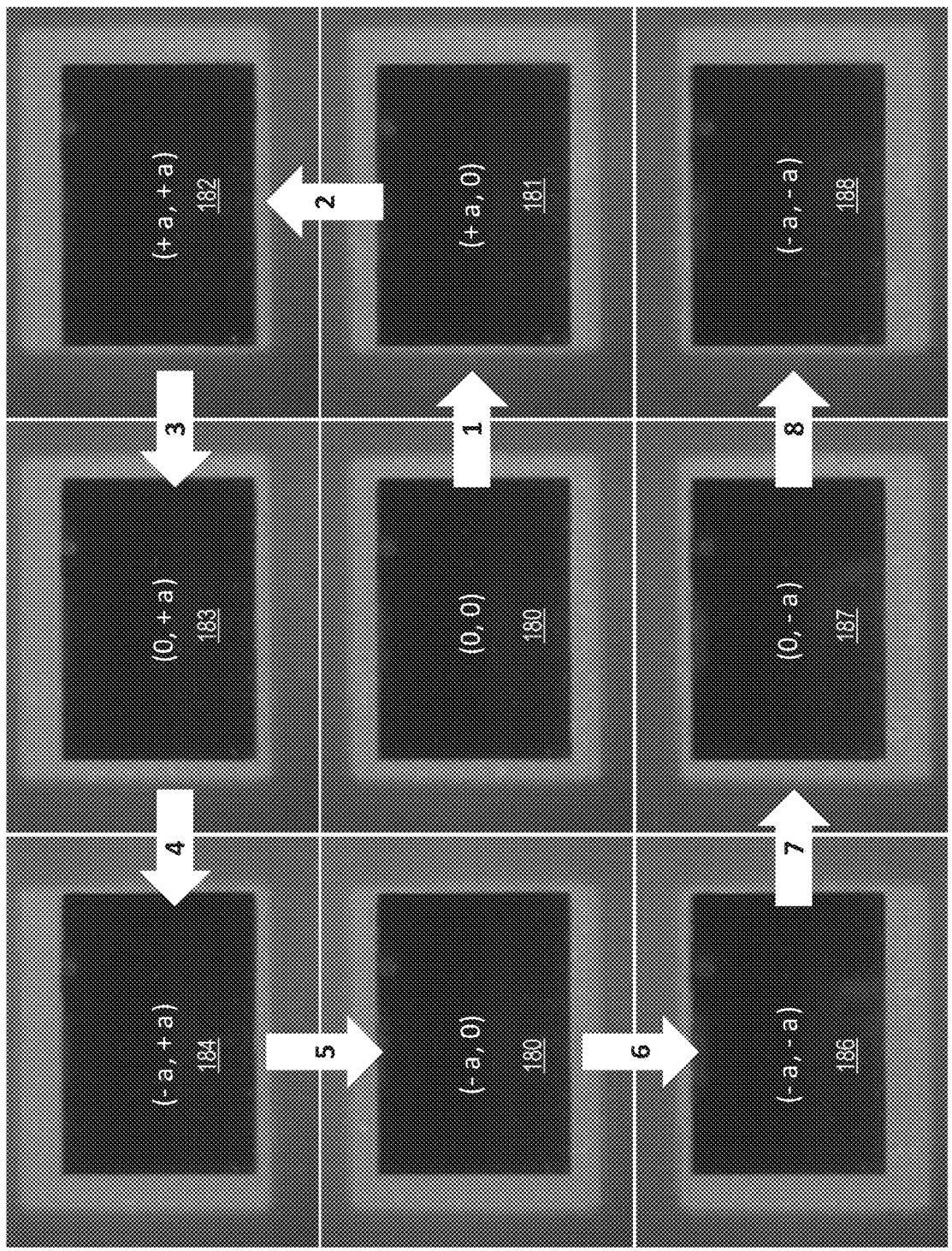

FIGS. 5a-5e illustrate generation of a calibration equation that is then used to correct X-Y positional misalignment after vision alignment. In FIG. 5a, the process begins with the performance of the vision alignment process to get beam 134 coarsely aligned to die 104. FIG. 5b shows LAB assembly 130 over die 104 after vision alignment. Beam 134 is illustrated as perfectly aligned with die 104, but the generation of the calibration equation does not depend on perfect alignment at the present stage. The following steps proceed in the same manner regardless of the alignment or misalignment existing after vision alignment in FIG. 5a.

FIG. 5b shows the footprint boundary 170 of die 104, and the footprint boundary 172 of beam 134. The footprint boundaries 170 and 172 are what will be captured by image-acquisition camera 138 and analyzed by computer algorithms to determine fine die-beam alignment.

FIG. 5c shows capture of the footprint boundaries 170 and 172 by a computer using image-acquisition camera 138. Substrate 120 in FIG. 5c has a plurality of semiconductor die 104 that are in the process being packaged into individual packages. After laser-assisted bonding, die 104 will be encapsulated and singulated. The calibration equation can be quickly re-calculated each time a new substrate is being processed by LAB assembly 130. Alternatively, the calibration equation can be generated only once or regenerated each time LAB assembly 130 is serviced, each time a new size of semiconductor die is being processed, or periodically, e.g., hourly, daily, monthly, etc.

The computer algorithm picks a die 104 for calibration, the top-left die 104 in FIG. 5c, and proceeds to capture a detailed image of boundaries 170 and 172 using image-acquisition camera 138. Image-acquisition camera 138 generates photographic data for input to the computer algorithm, as illustrated by photo 180 in FIG. 5c. Photo 180 from image-acquisition camera 138 shows the entire footprint of beam 134 on die 104 and substrate 120, with contrast between the substrate, beam, and die represented as different shades of gray. In practice, a color sensor is usually used, and photo 180 would illustrate beam 134 as hot pink or another bright color outside of die 104.

In some embodiments, a sheet of white paper is placed on substrate 120 with cutouts to accommodate die 104 to increase contrast. The paper could be any other color as well. Adhesive tape of any color could be used instead of paper. Substrate 104 could also be painted with a brush, spray, or another method with any color to increase contrast. Substrate 104 can be coated with any material of any color to increase contrast. The contrasting agents just listed could be added before or after placing die 104 on substrate 120 and may cover the locations the die are placed prior to the die being mounted if the particular contrast method being used is compatible with laser-assisted bonding. The contrasting agent may be applied to substrate 120 only immediately around die 104 and not to the entire substrate.

Alternatively, or in addition to, an agent being disposed on substrate 120 to increase contrast, any of the above-listed contrasting agents can be added to the back surface of die 104. In one embodiment, black paint or another suitable material is added to back surface 108 of die 104 to increase absorption of beam 134 within the footprint of die 104, and white tape is added to substrate 120 outside the footprint of die 108 to increase reflection of beam 134. Adding of contrasting agents is optional but recommended. Contrasting agents can be disposed on substrate 120 only, on die 104 only, or a combination of contrasting agents can be used on both the substrate and die. Contrasting can be used for all manufactured units, not only the calibration process.

Computer image processing is used to take photo 180 as an input and then output a pixel map of boundaries 170 and 172. Intermediate image 180c in FIG. 5c shows photo 180 after image processing. The image processing to generate intermediate image 180c involves any combination of filtering, increasing contrast, sharpening, smoothening, binarization (i.e., converting pixels into one of two possible values, e.g., 1 or 0), etc. suitable to positively identify boundaries 170 and 172 in photo 180. After image processing, intermediate image 180c shows the footprint of die 104 as perfectly black, the footprint of beam 134 outside of the die as perfectly white, and substrate 120 outside of the beam as perfectly black. Black and white are used as those colors are highly contrasted to a human eye. However, any two or three numerical values could be used to distinguish the areas of die 104, beam 134, and substrate 120 outside of the beam. Intermediate image 180c can be used by a computer algorithm to identify boundaries 170 and 172 by looking for the boundaries between black pixels and white pixels.

Image 180a in FIG. 5c shows a portion of photo 180 with computer-generated boundaries 170 and 172 overlaid, along with computer-generated output indicating the positions and rotations of beam 134 and die 104. The computer-generated boundaries are analyzed to determine the X, Y center pixel coordinates in photo 180 captured by image-acquisition camera 138, and also an angle of rotation for each boundary in degrees, radians, or another suitable another unit. Image 180a shows that the center coordinate of beam 134 is at pixel (777, 556) in the X-Y plain, and the center coordinate of die 104 is at pixel (775, 551). The coordinates indicate a pixel in the image as a whole, with the first number indicating a number of pixels from the left edge of photo 180 and the second number indicating a number of pixels from the top edge of the photo. The top-left corner in the figures is used as the coordinate system origin, but any other reference for the coordinate system can be used in other embodiments. Determining the X, Y coordinate of the centers of beam 134 and die 104 can be as simple as calculating the average coordinate of each pixel along their respective black-white boundaries in intermediate image 180c. Any suitable algorithm can be used to generate X, Y coordinates for the center of beam 134 and die 104 from photo 180. In ideal alignment, the centers of die 104 and beam 134 would be on the same pixel in photo 180.

The X, Y coordinates of beam 134 relative to die 104 in image 180 serves as a reference position for the calibration process. FIG. 5d shows image 180 as reference point (0, 0), indicating that image 180 was taken with zero movement of LAB assembly 130 after vision alignment was completed. Next, the gantry is moved a fixed distance in each cardinal direction (up, down, left, and right) as well as each diagonal intercardinal direction, for a total of nine images 180-188 including the reference position (0,0). The character 'a' in FIG. 5d represents the distance of movement for each position from the reference position. The distance 'a' will typically be on the order of a millimeter or a few millimeters, but any suitable distance can be used.

In one embodiment, each image 180-188 is taken and then the vision alignment process is repeated to return to the reference position before moving to take another image at another of the eight positions. In another embodiment, as illustrated by the arrows in FIG. 5d, each image is taken by moving in a square around the reference position. After image 180 is taken at the reference position, the gantry moves LAB assembly 130 by the distance 'a' to the right in the illustrated view. Photo 181 is taken after moving distance 'a' to the right, putting LAB assembly 130 at position (a, 0). The gantry then moves LAB assembly 130 a distance 'a' on the Y-axis to position (a, a) and takes photo 182.

The gantry moves LAB assembly 130 a distance 'a' after each photo in a direction indicated by the arrows on FIG. 5d until a photo is taken at each of the nine positions. The center coordinate of beam 134 in each of the nine photos 180-188 is extracted using the previously described image processing and computer vision algorithms, or other suitable processing and algorithms.

After all eight photos surrounding the reference position have their center coordinates calculated, linear regression is applied to get a correlation between gantry movement in millimeters and center coordinate displacement in pixels. The resulting equation is the calibration equation for X-Y position and will be used in subsequent processing to move the center point of beam 134 over the center point of die 104 after the coarse vision alignment process. In some embodiments, additional positions rather than just the eight cardinal and intercardinal directions are used to generate more points for linear regression. For instance, in one specific embodiment the gantry is moved a, 2a, and 3a millimeters in each of the four cardinal directions. A linear regression can be performed using images at any arbitrary set of locations relative to a reference position.

Figure 5E:
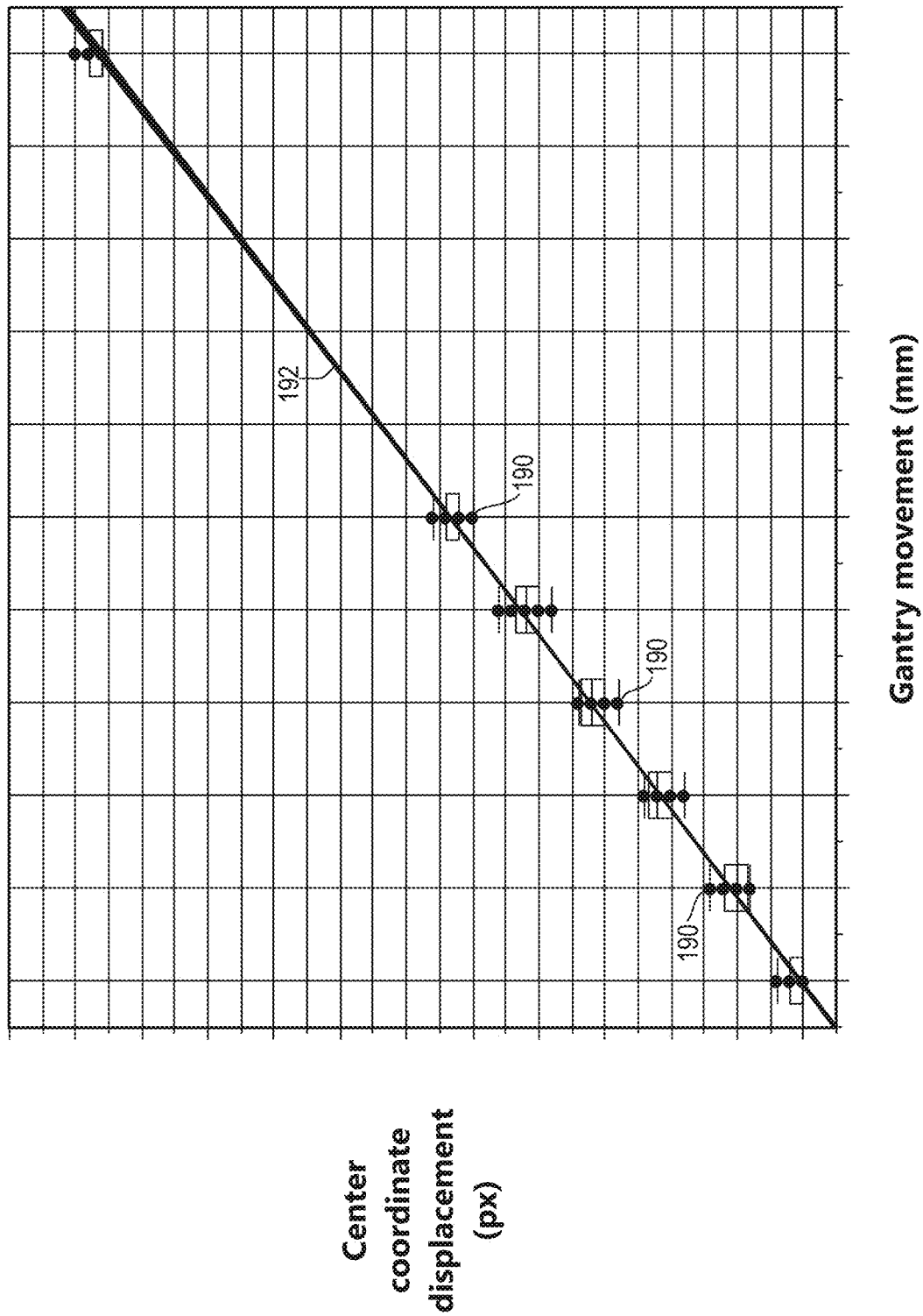

FIG. 5e shows an example linear regression. A point 190 is placed on the graph for each photo 181-188 at the point where the X-axis indicates the gantry movement for that point in millimeters and the Y-axis indicates the displacement in pixels for the photo relative to the reference photo 180. A line 192 is the result of linear regression and can be calculated in a variety of ways. The equation for the line is the calibration equation for X-Y position, which can be in the format y=mx+b or any other suitable format. The calibration equation is later used to center beam 134 over die 104 by taking a picture of the die being processed using image-acquisition camera 138, calculating the number of pixels in the photo from the center of the die to the center of the beam, and inputting the number of pixels into the calibration equation. The equation outputs a distance in millimeters, or any other suitable unit of distance, that the gantry needs to move LAB assembly 130 to center homogenizer 132 over die 104. The correction can be made in the X and Y direction separately using the same equation, or the distance can be calculated diagonally with an accompanying angle that the gantry should move to center beam 134. In other embodiments, two separate calibration equations are generated for corrections along the X-axis and Y-axis.

Figure 6A:
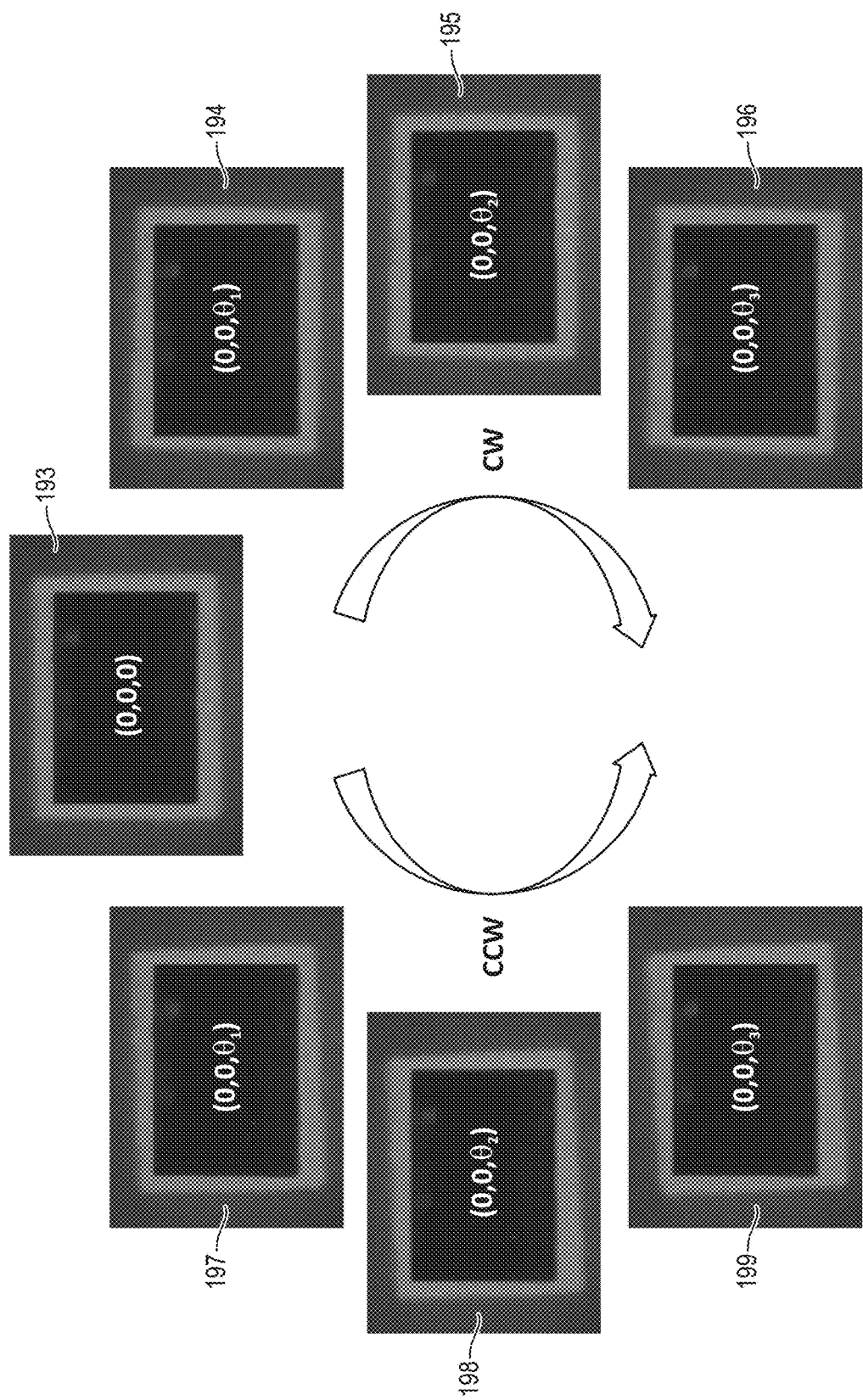
FIGS. 6a and 6b illustrate generation of a calibration equation used for subsequent fine die-beam alignment of rotation angle.
Figure 6B:
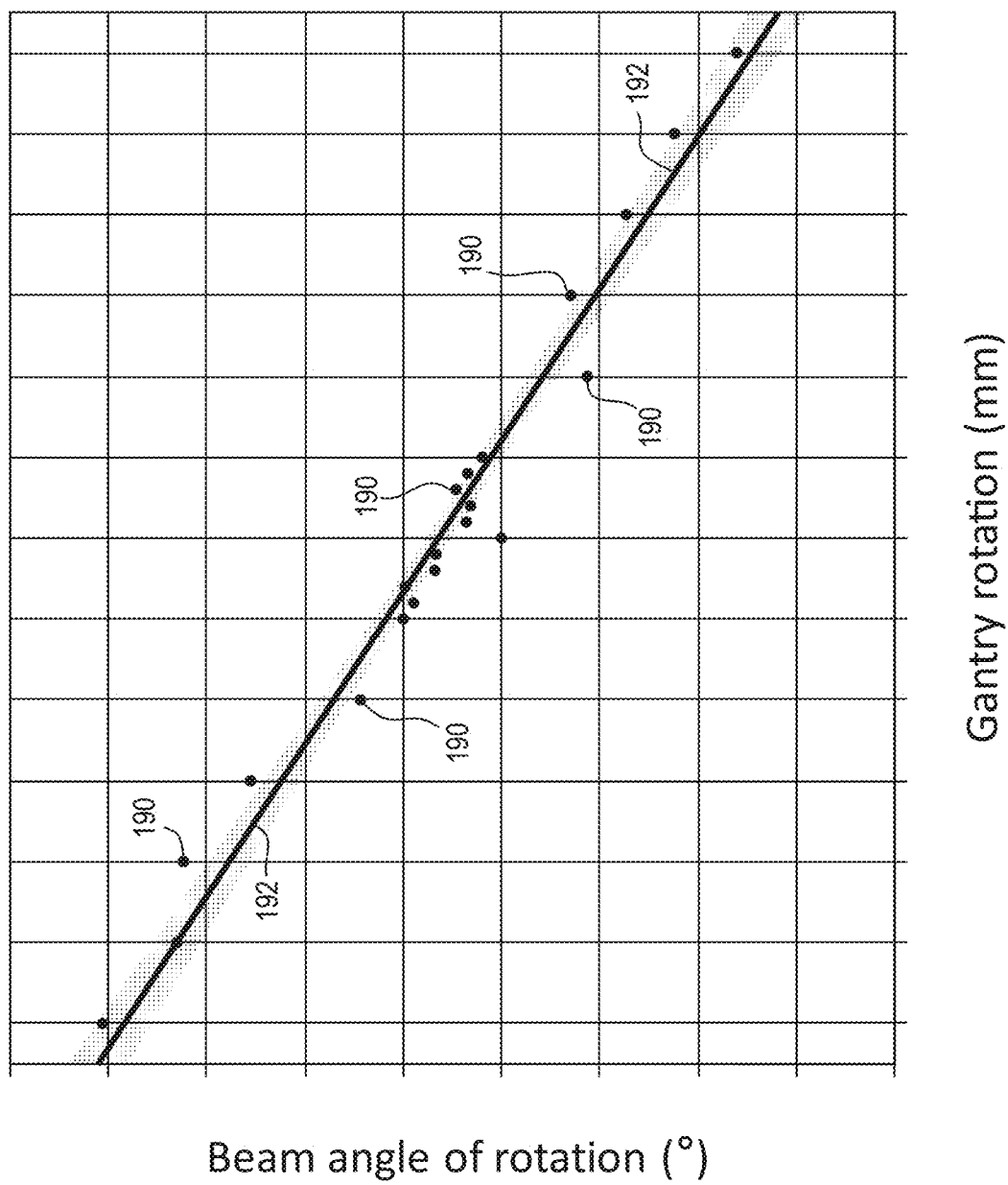

FIGS. 6a and 6b illustrate generation of a calibration equation for rotational correction. The rotational calibration equation can be determined before the positional calibration equation if desired. The vision alignment process is again used to return homogenizer 132 to a reference position if needed. For rotational calibration, the coordinates include an angle of rotation in addition to X, Y position. Photo 193 in FIG. 6a is taken at the reference position of (0, 0, 0). The three coordinate numbers are X-axis offset, Y-axis offset, and rotational offset from the reference position set by vision alignment. Photo 193 is taken after vision alignment without any movement or rotation of LAB assembly 130. In some embodiments, reference photo 180 is reused as the reference for rotational calibration.

After a reference photo 193 is taken using image-acquisition camera 138, the gantry rotates LAB assembly 130 and additional photos are taken. In FIG. 6a, three photos 194, 195, and 196 are taken at various rotational angles clockwise from the reference position, and three photos 197, 198, and 199 are taken with a variety of counter-clockwise rotation.

As with the X-Y positional calibration equation in FIGS. 5a-5e, rotational calibration uses image processing and computer analysis to identify the boundary lines 170 and 172 of die 104 and beam 134, respectively, in each of the photographs 193-199 in FIG. 6a. Rotational instructions to the gantry are typically given in millimeters. Stepper motors are used for both rotation and X-Y movement, and all movement operations are in millimeters due to the nature of stepper motors and the software that controls them. A linear regression is performed as in FIG. 5e but for rotation of LAB assembly 130 in photos 193-199. FIG. 6b shows a plot of each sample, with the stepper motor's millimeter rotation on the X-axis and the measured rotation angle from image processing on the Y-axis. Again, similar to the X-Y position calibration equation, the linear regression generates a rotation calibration equation that can be used to translate from an amount of detected rotation in degrees to an amount of LAB assembly 130 rotation in the stepper motor's millimeters.

FIGS. 7a-7e illustrate using the above-determined calibration equations to align beam 134 and die 104 during subsequent manufacturing. In FIG. 7a, the vision alignment process with vision camera 136 is completed to locate LAB assembly 130 over a die 104 to be processed. FIG. 7b illustrates misalignment after completion of the vision alignment process. After vision alignment, image-acquisition camera 138 takes a photo for determination of the beam and die boundaries using image processing. FIG. 7c illustrates boundary 170 of die 104 and boundary 172 of beam 134 on substrate 120 having been calculated by image processing and computer vision algorithms. The computer vision algorithms calculate an angle of rotation θ and X-Y positional difference β between die 104 and beam 134 by comparing the respective boundaries 170 and 172.

To perform fine adjustment of die-beam alignment using the calibration equations, the value of θ in, e.g., degrees is plugged into the rotation calibration equation. The rotation calibration equation provides a value in millimeters that is then given to the stepper motor controlling rotation of LAB assembly 130 as an instruction to rotate. FIG. 7d shows beam 134 having been rotated to correct for the rotational offset. Next, the X-Y displacement in number of pixels is entered into the X-Y calibration equation, which gives a displacement in millimeters that the stepper motors need to move LAB assembly 130. An angle of movement is also provided by comparing the relative positions of the centers of beam 134 and die 104. As mentioned above, the equation can be used twice to separately correct for an X-axis offset and Y-axis offset in two separate steps. In some embodiments, two separate calibration equations are used, one for the X-axis and one for the Y-axis.

The stepper motors are provided instructions with the proper movement parameters as output by the X-Y position calibration equation, and beam 134 is moved by the stepper motors accordingly to have its center aligned with the center of die 104 as shown in FIG. 7e. The positional correction can also occur prior to the rotational correction if desired, or all stepper motor instructions for rotation and position correction can be issued at once. In some embodiments, a means other than stepper motors is used to move and rotate LAB assembly 130. The calibration procedures disclosed herein still work the same for means other than stepper motors.

With beam 134 aligned to die 104, the beam is maintained for sufficient time to reflow bumps 114 and couple the die to substrate 120. In some embodiments, the energy level of beam 134 is increased for reflow after alignment is complete. Once reflow is completed, the gantry moves and uses vision camera 136 to center LAB assembly 130 over the next die 104 to process. The alignment and LAB process of FIGS. 7a-7e is repeated for each semiconductor die 104 on substrate 120 that needs processed.

In some embodiments, the gantry used to move LAB assembly 130 over die 104 is not used for fine adjustment of homogenizer 132. Rather, LAB assembly 130 includes a separate mechanism to move homogenizer 132 within the LAB assembly. In such embodiments, the internal mechanism to move homogenizer 132 is used to both generate the calibration equations and then also to fine adjust the homogenizer during subsequent manufacturing.

Using the calibration equations for die-beam alignment ensures that beam 134 is properly aligned to die 104 for each die being manufactured. Manufacturing defects are reduced by containing thermal energy to the expected areas. For proper alignment, the center of beam 134 should be directly on the center of die 104, and the edges of the die and beam should be parallel. While prior art die-beam alignment, which only uses visual inspection by naked-eye, can provide some sense of alignment, the above described calibration equations provide a rigorous metric for quantitative evaluation of die-beam alignment. Both angle of rotation and alignment of center coordinates are verified by computer analysis.

Once all die 104 on a substrate 120 are bonded, manufacturing proceeds with other desired steps. For example, in FIG. 8a a plurality of die 104 are bonded to substrate 120. An encapsulant or molding compound 200 is deposited over substrate 120 in FIG. 8b using paste printing, compressive molding, transfer molding, liquid encapsulant molding, vacuum lamination, spin coating, or another suitable applicator. Encapsulant 200 can be polymer composite material, such as epoxy resin, epoxy acrylate, or polymer with or without a filler. Encapsulant 200 is non-conductive, provides structural support, and environmentally protects the semiconductor device from external elements and contaminants.

The panel formed by substrate 120 and encapsulant 200 is singulated in FIG. 8c using a saw blade, water cutting tool, or laser cutting tool 202 into individual semiconductor packages 204. Packages 204 are usually stored in a tape-and-reel after singulation for distribution to electronic device manufacturers who will integrate the devices into their products. Substrate 120 includes electrically conductive layers and other interconnect structures used to route signals through the substrate. The bottom surface of substrate 120, opposite die 104, will typically have a ball grid array, land grid array, or other type of interconnect structure for electrical connection to the larger electronic device. FIGS. 8a-8c are intended to illustrate just one of the many different ways a package can be completed after laser-assisted bonding. Any type of substrate can have a semiconductor die bonded thereto with laser-assisted bonding, and any processing desired can be performed after laser-assisted bonding.

Figure 9:
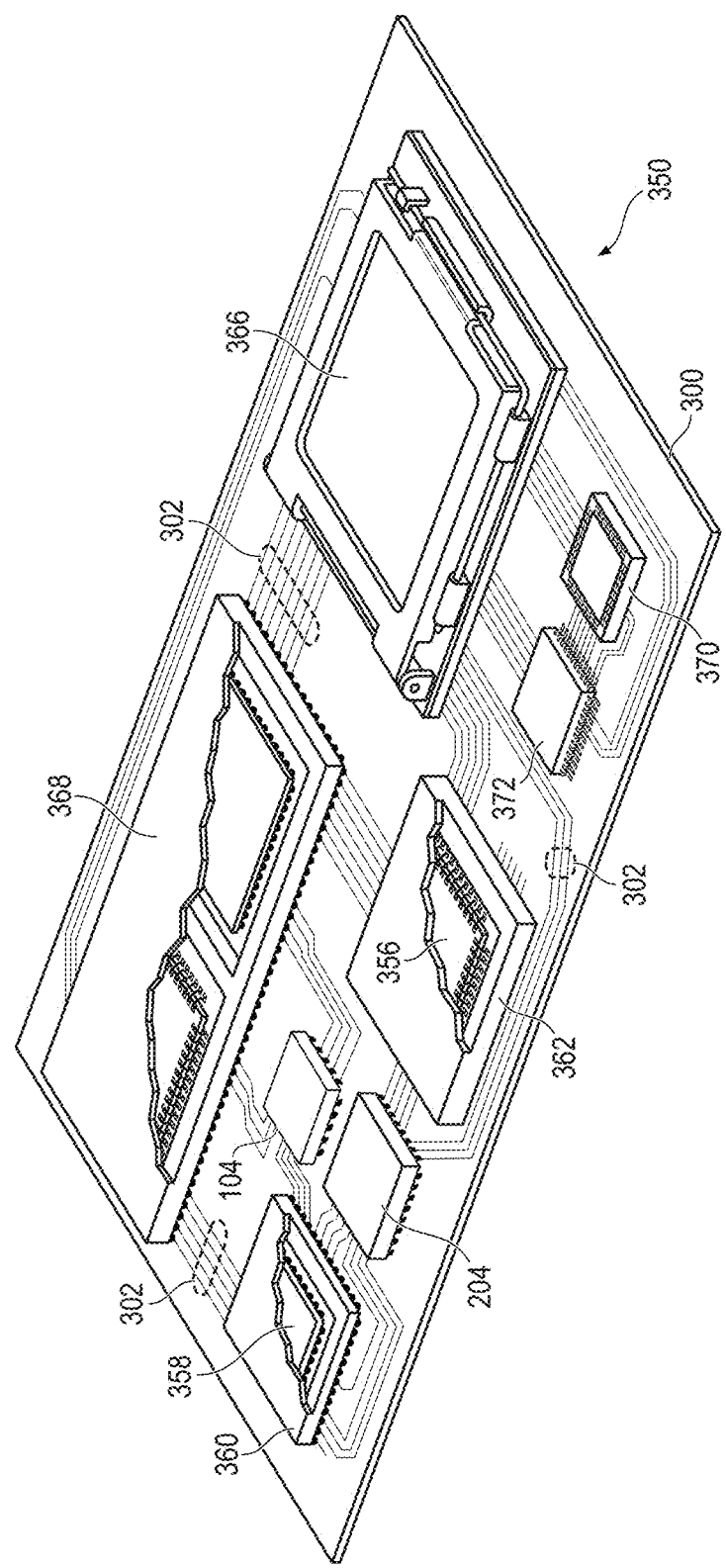
FIG. 9 illustrates an electronic device with laser-assisted bonded devices.

FIG. 9 illustrates electronic device 350 including PCB 300 with a plurality of semiconductor packages mounted on a surface of the PCB, including a package 204 and a die 104. Electronic device 350 can have one type of semiconductor package, or multiple types of semiconductor packages, depending on the application. Die 104 mounted directly to PCB 300 shows that the die-beam alignment process can be used for mounting a die directly to a device substrate 300, in addition to a package substrate 120.

Electronic device 350 can be a stand-alone system that uses the semiconductor packages to perform one or more electrical functions. Alternatively, electronic device 350 can be a subcomponent of a larger system. For example, electronic device 350 can be part of a tablet computer, cellular phone, digital camera, communication system, or other electronic device. Electronic device 350 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

PCB 300 provides a general substrate for structural support and electrical interconnection of the semiconductor packages mounted on the PCB. Conductive signal traces 302 are formed over a surface or within layers of PCB 300 using evaporation, electrolytic plating, electroless plating, screen printing, or other suitable metal deposition process. Signal traces 302 provide for electrical communication between the semiconductor packages, mounted components, and other external systems or components. Traces 302 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 300. In other embodiments, a semiconductor device may only have the first level packaging where the die is mechanically and electrically mounted directly to PCB 300.

For the purpose of illustration, several types of first level packaging, including bond wire package 356 and flipchip 358, are shown on PCB 300. Additionally, several types of second level packaging, including ball grid array (BGA) 360, bump chip carrier (BCC) 362, land grid array (LGA) 366, multi-chip module (MCM) 368, quad flat non-leaded package (QFN) 370, and quad flat package 372 are shown mounted on PCB 300 along with die 104 and package 204. Conductive traces 302 electrically couple the various packages and components disposed on PCB 300.

Depending upon the system requirements, any combination of semiconductor packages, configured with any combination of first and second level packaging styles, as well as other electronic components, can be connected to PCB 300. In some embodiments, electronic device 350 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    disposing a first semiconductor die over a substrate;
    disposing a beam homogenizer over the first semiconductor die in a first position, wherein a beam from the beam homogenizer impacts the first semiconductor die;
    generating a first calibration equation by,
        capturing a first image of the first semiconductor die and beam using a camera with the beam homogenizer in the first position over the first semiconductor die,
        calculating a first positional offset of the beam relative to the first semiconductor die in a first number of pixels by using image processing on the first image,
        moving the beam homogenizer a first known distance to a second position over the first semiconductor die,
        capturing a second image of the first semiconductor die and beam using the camera with the beam homogenizer in the second position over the first semiconductor die,
        calculating a second positional offset of the beam relative to the first semiconductor die in a second number of pixels by using image processing on the second image, and
        performing a first linear regression with the first known distance, first number of pixels, and second number of pixels;
    returning the beam homogenizer to the first position over the first semiconductor die after generating the first calibration equation;
    generating a second calibration equation by,
        capturing a third image of the first semiconductor die and beam using the camera with the beam homogenizer in the first position over the first semiconductor die,
        calculating a first rotational offset of the beam relative to the first semiconductor die as a first angle value by using image processing on the third image,
        rotating the beam homogenizer a second known distance to a third position over the first semiconductor die,
        capturing a fourth image of the first semiconductor die and beam using the camera with the beam homogenizer in the third position over the first semiconductor die,
        calculating a second rotational offset of the beam relative to the first semiconductor die as a second angle value by using image processing on the fourth image, and
        performing a second linear regression with the second known distance, first angle value, and second angle value;
    returning the beam homogenizer to the first position over the first semiconductor die after generating the second calibration equation;
    calculating a third positional offset of the beam relative to the first semiconductor die in a first unit;
    using the first calibration equation to convert the third positional offset into a first distance in a second unit;
    moving the beam homogenizer the first distance to center the first semiconductor die fully within the beam;
    calculating a third rotational offset of the beam relative to the first semiconductor die in a third unit;
    using the second calibration equation to convert the third rotational offset into a second distance in a fourth unit;
    rotating the beam homogenizer the second distance to rotationally align the beam to the first semiconductor die;
    disposing the beam homogenizer over a second semiconductor die;
    calculating a fourth positional offset of the beam relative to the second semiconductor die in the first unit;
    using the first calibration equation to convert the fourth positional offset into a third distance in the second unit;
    moving the beam homogenizer the third distance to center the second semiconductor die fully within the beam;
    calculating a fourth rotational offset of the beam relative to the second semiconductor die in the third unit;

using the second calibration equation to convert the fourth rotational offset into a fourth distance in the fourth unit; and rotating the beam homogenizer the fourth distance to rotationally align the beam to the second semiconductor die.

2. The method of claim 1, further including generating the first calibration equation by performing the first linear regression on a plurality of known positional offsets.

3. The method of claim 1, further including reflowing a plurality of bumps disposed between the semiconductor die and substrate using the beam.

4. The method of claim 1, further including disposing the beam homogenizer over the semiconductor die by:
   locating a first corner of the semiconductor die;
   locating a second corner of the semiconductor die opposite the first corner; and
   moving the beam homogenizer to the average position between the first corner and second corner.

5. The method of claim 1, further including calculating the first positional offset by:
   determining a first boundary of the semiconductor die;
   determining a second boundary of the beam; and
   comparing the first boundary and second boundary.

6. The method of claim 1, further including regenerating the first calibration equation and second calibration equation periodically using a third semiconductor die.

7. A method of making a semiconductor device, comprising:
   disposing a first semiconductor die over a substrate;
   disposing a beam homogenizer over the first semiconductor die in a first position using a first camera, wherein a beam from the beam homogenizer impacts the first semiconductor die;
   generating a second calibration equation by,
      capturing a third image of the first semiconductor die and beam using a second camera with the beam homogenizer in the first position over the first semiconductor die, wherein the second camera is a different type of camera from the first camera,
      calculating a first rotational offset of the beam relative to the first semiconductor die as a first angle value by using image processing on the third image,
      rotating the beam homogenizer a second known distance to a third position over the first semiconductor die,
      capturing a fourth image of the first semiconductor die and beam using the second camera with the beam homogenizer in the third position over the first semiconductor die,
      calculating a second rotational offset of the beam relative to the first semiconductor die as a second angle value by using image processing on the fourth image, and
      performing a second linear regression with the second known distance, first angle value, and second angle value;
   returning the beam homogenizer to the first position over the first semiconductor die after generating the second calibration equation;
   calculating a third rotational offset of the beam relative to the first semiconductor die in a third unit using image processing on an image from a second camera;
   using the second calibration equation to convert the third rotational offset into a second distance in a fourth unit;
   rotating the beam homogenizer the second distance to rotationally align the beam to the first semiconductor die;
   disposing the beam homogenizer over a second semiconductor die;
   calculating a fourth rotational offset of the beam relative to the second semiconductor die in the third unit;
   using the second calibration equation to convert the fourth rotational offset into a fourth distance in the fourth unit; and
   rotating the beam homogenizer the fourth distance to rotationally align the beam to the second semiconductor die.

8. The method of claim 7, further including generating the second calibration equation by performing the second linear regression on a plurality of known rotational offsets.

9. The method of claim 7, further including disposing the beam homogenizer over the semiconductor die by:
   locating a first corner of the semiconductor die;
   locating a second corner of the semiconductor die opposite the first corner; and
   moving the beam homogenizer to the average position between the first corner and second corner.

10. The method of claim 7, further including reflowing a plurality of bumps disposed between the semiconductor die and substrate using the beam.

11. The method of claim 7, further including performing image processing on the third image to determine a first boundary of the semiconductor die and a second boundary of the beam.

12. A method of making a semiconductor device, comprising:
   disposing a beam homogenizer over a semiconductor die in a first position with a beam from the beam homogenizer disposed onto the semiconductor die and with an entire footprint of the semiconductor die within the beam of light;
   generating a second calibration equation by,
      capturing a third image of the first semiconductor die and beam using a camera with the beam homogenizer in the first position over the first semiconductor die,
      calculating a first rotational offset of the beam relative to the first semiconductor die as a first angle value by using image processing on the third image,
      rotating the beam homogenizer a second known distance to a third position over the first semiconductor die,
      capturing a fourth image of the first semiconductor die and beam using the camera with the beam homogenizer in the third position over the first semiconductor die,
      calculating a second rotational offset of the beam relative to the first semiconductor die as a second angle value by using image processing on the fourth image, and
      performing a second linear regression with the second known distance, first angle value, and second angle value;
   returning the beam homogenizer to the first position over the first semiconductor die after generating the second calibration equation;
   calculating a third rotational offset of the beam homogenizer relative to the semiconductor die in a third unit while the beam homogenizer is disposed over the semiconductor die with the beam impacting the semiconductor die;

using the second calibration equation to convert the third rotational offset into a second distance in a fourth unit; and rotating the beam homogenizer the second distance to rotationally align the beam to the semiconductor die.

13. The method of claim 12, further including generating the second calibration equation by performing the second linear regression on a plurality of known offsets.

14. The method of claim 12, further including reflowing a plurality of bumps disposed under the semiconductor die using the beam homogenizer.

* * * * *